(12) United States Patent
Blednov (10) Patent No.: US 9,685,915 B2
(45) Date of Patent: Jun. 20, 2017

(54) AMPLIFICATION STAGE AND WIDEBAND POWER AMPLIFIER

(71) Applicant: FREESCALE SEMICONDUCTOR, INC., Austin, TX (US)

(72) Inventor: Igor Blednov, Toulouse (FR)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 14/439,050

(22) PCT Filed: Oct. 31, 2012

(86) PCT No.: PCT/IB2012/002652
§ 371 (c)(1),
(2) Date: Apr. 28, 2015

(87) PCT Pub. No.: WO2014/068351
PCT Pub. Date: May 8, 2014

(65) Prior Publication Data
US 2015/0295547 A1 Oct. 15, 2015

(51) Int. Cl.
| | |
|---|---|
| *H03F 3/191* | (2006.01) |
| *H03F 1/42* | (2006.01) |
| *H03F 1/02* | (2006.01) |
| *H03F 3/195* | (2006.01) |
| *H03F 3/21* | (2006.01) |

(Continued)

(52) U.S. Cl.
CPC .......... *H03F 1/42* (2013.01); *H03F 1/0288* (2013.01); *H03F 3/195* (2013.01); *H03F 3/211* (2013.01); *H03F 3/24* (2013.01); *H03F 3/245* (2013.01); *H03F 3/602* (2013.01); *H03F 3/604* (2013.01); *H03F 2203/21106* (2013.01); *H03F 2203/21142* (2013.01)

(58) Field of Classification Search
CPC .......... H03F 3/191; H03F 3/193; H03F 3/195
USPC ........................................ 330/302, 305, 306
See application file for complete search history.

(56) References Cited

U.S. PATENT DOCUMENTS

| | | | |
|---|---|---|---|
| 6,788,169 | B1 | 9/2004 | Schemmann et al. |
| 7,078,976 | B2 | 7/2006 | Blednov |

(Continued)

OTHER PUBLICATIONS

International Search Report and Written Opinion correlating to PCT/IB2012/002652 dated Nov. 25, 2014.

*Primary Examiner* — Steven J Mottola (57) ABSTRACT

An amplification stage and a wideband power amplifier are provided. The amplification stage includes a stage input terminal, a stage output terminal, an amplifier, an input compensation network, and in output compensation network. At the stage input terminal is received a signal which is provided via the input compensation network to the amplifier. The input compensation network filters the signal to allow a wideband operation of the amplification stage around an operational frequency. The amplified signal provided by the amplifier is provided via the output compensation network to the stage output terminal. The output compensation network configured to allow a wideband operation of the amplification stage around the operational frequency with a minimal phase shift and distortion of amplitude and phase frequency response. The wideband power amplifier includes a plurality of amplification stage combined with transmission lines or their lumped element equivalents in a specific circuit topology.

18 Claims, 8 Drawing Sheets

(51) Int. Cl.
*H03F 3/24* (2006.01)
*H03F 3/60* (2006.01)

(56) References Cited

U.S. PATENT DOCUMENTS

| | | | |
|---|---|---|---|
| 7,119,623 | B2 | 10/2006 | Blednov et al. |
| 7,884,668 | B2 | 2/2011 | Blednov |
| 8,717,102 | B2 | 5/2014 | Wilson et al. |
| 2005/0189995 | A1 | 9/2005 | Kee et al. |
| 2007/0210866 | A1* | 9/2007 | Sato .................. H03F 3/195 330/126 |
| 2009/0021309 | A1 | 1/2009 | Zheng |
| 2009/0189696 | A1* | 7/2009 | Deng .................. H03F 1/0205 330/302 |
| 2009/0273397 | A1 | 11/2009 | Bockelman et al. |
| 2011/0080215 | A1 | 4/2011 | Meng |
| 2013/0241639 | A1 | 9/2013 | Wilson et al. |

\* cited by examiner

AMPLIFICATION STAGE AND WIDEBAND POWER AMPLIFIER

FIELD OF THE INVENTION

This invention relates to amplification stages for use in wideband power amplifiers and relates to wideband power amplifiers. In specific embodiments, the wideband power amplifier may be a Doherty amplifier.

BACKGROUND OF THE INVENTION

The mobile communications industry is ever demanding for more efficient power amplifiers for mobile base stations, which are also able to operate in a wider frequency band allowing a larger data rate or traffic (i.e. transmit more information per second). For example, one carrier of an older generation mobile WCDMA occupies 4 MHz of bandwidth, while new generations like LTE use 10 MHz and 20 MHz carrier bandwidth. In proposals for future generations of mobile communication technology, the carrier bandwidth is going for 40 MHz up to 100 MHz of digital modulation band per carrier.

Power amplifiers operating as final stages of mobile base station transmitters are the most demanding components due to required output power levels, high power efficiency at Back-Off and high linearity. Among high Efficiency power amplifiers technologies like Linear Amplification with Non-linear Components (LINC) and Envelope Tracking (ET) using Switch Mode power amplifier (SMPA), the Doherty power amplifier (DPA) is the most mature technology due to its relative simplicity.

One of the most notorious limitation of recent traditional high power Doherty power amplifiers was a narrow frequency operational bandwidth, which was not properly analyzed and frequently mentioned and reported in papers as presumably caused by the impedance inverter or so called Doherty Combiner.

In U.S. Pat. No. 7,078,976, it was demonstrated that the Doherty amplifier relative bandwidth can be expanded up to 30%, and that >3 time load line modulation is possible, if impedance transformation networks in the traditional design of the Doherty amplifier between the output of main amplifying device and the Doherty combiner are excluded from the Doherty amplifier architecture, and a lumped element Doherty combiner made of a chain of low impedance prototype is connected directly to the output of the main device absorbing parasitic output capacitance.

U.S. Pat. No. 7,078,976 also points out that the input network is no less important for wideband operation of Doherty amplifier, and proposes to use a low-pass network to connect the input of the main and peak devices to allow a similar phase frequency response, as well as to use a separate and independent input drive of the Mmin and peak device allowing an arbitrary phase and amplitude control of the input signal for each these devices, which even further improves the operational bandwidth and linearity vs power efficiency.

Another issue for power amplifiers is low stability and/or drops of the power supply voltage at the output terminal of the device, which happen during and after at sharp raises and peaks of the amplified signal envelope. This can be caused by parasitic inductances existing between the active die and the power supply terminal. The result of these events are so termed 'memory effects' which require sophisticated digital correction technology.

Traditionally, the power supply of an RF power device on an application board is made of quarter wavelength microstrip lines connected to the output match structures on the printed circuit board (PCB), introducing typically no less than 7 nH of parasitic inductance for 2 GHz amplifiers. For 1 GHz power amplifiers this inductance becomes even higher, typically >14 nH. The larger this inductance and the modulation frequency in the spectrum of RF envelope of the signal, the stronger the presence of memory effects in the output signal of the device.

U.S. Pat. No. 7,119,623 proposes to resolve this an additional lead through which the supply voltage is directly connected to the internal capacitor which connects a compensation shunt inductance Lsh to ground. U.S. Pat. No. 7,119,623 states that the device design in a standard discrete package with additional leads where an external large capacitance is connected to the die inside the package through a much smaller parasitic inductance of additional leads (<1.5 nH) allows an improvement of the electrical "memory effects" compared to the traditional power supply connection through quarter wave lines.

Additionally, when the shunt inductance Lsh is implemented by bond wires connected between the die and the grounding capacitor, the required distance between the die and the package lead is rather large, around 2 mm. For devices operating at frequencies below 1 GHz, the required shunt inductance Lsh value become so large that two steps or loops of bond wire are needed (as shown in U.S. Pat. No. 7,119,623), which requires an even larger spacing. This creates an undesired parasitic inductance Ld by wires connecting the drain metal bar of the die to the output lead of the package and/or the Doherty power combine network.

The parasitic inductance Ld together with parasitic capacitance of a package lead causes an undesired impedance transformation and introduces an additional phase shift of the signal at the device output, and require an additional 180 degrees of electrical length of the impedance transformer between the Main device and the Doherty combiner, the so called "offset line". This results in an even larger phase shift which limits the operational bandwidth well below that of the 30% claimed by U.S. Pat. No. 7,078,976. This parasitic inductance is especially harmful in case large dies are used, which even further limits the realization of a wideband high power Doherty power amplifier.

Further, it is to be noted that the output network is not the only important factor for a Doherty amplifier. As realized by the inventors, the proper design of input network is equally important, however, the prior art documents ignore the input network architecture. In fact state of the art Doherty amplifiers with Pout>100 W use LDMOS devices, which exhibit a very low input impedance at a high input Q factor of 6 and 12 at respectively 2 GHz and 1 GHz. The required impedance transformation of input matching networks is therefore much higher than that required for the device output, and the input bandwidth is less than the output bandwidth. As a result, the phase characteristics of the input network of the traditional Doherty power amplifier has a different rate versus frequency than that the output network, which even further affects operational bandwidth.

SUMMARY OF THE INVENTION

The present invention provides an amplification stage, a wideband power amplifier, and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1A:
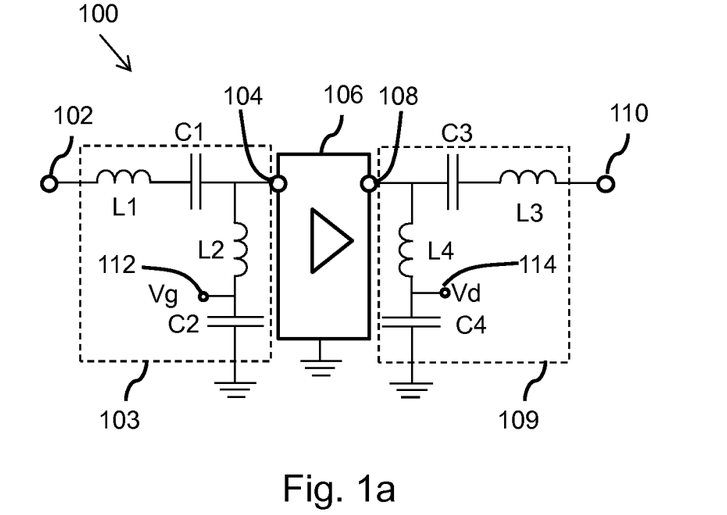
FIG. 1a schematically shows a circuit diagram of an example of an embodiment of an amplification stage, FIG. 1b schematically shows a circuit diagram of another example of an embodiment of an amplification stage, FIG. 2a schematically shows a cross-sectional view of an implementation of a portion of an embodiment of an amplification stage in LTCC technology, FIG. 2b schematically shows an implementation of a portion of an embodiment of an amplification stage in IPD technology, FIG. 3 schematically shows a circuit diagram of a further example of an embodiment of an amplification stage, FIG. 4 schematically shows a block diagram of an example of an embodiment of a wideband power amplifier, FIG. 5 schematically shows a block diagram of another example of an embodiment of a wideband power amplifier, and FIG. 6 schematically shows a block diagram of a further example of an embodiment of a wideband power amplifier, FIG. 7 schematically shows a block diagram of a subsequent example of an embodiment of a wideband power amplifier, and FIG. 8a schematically shows a top view of an implementation of a portion of an embodiment of an amplification stage in LTCC or IPD technology, and FIG. 8b schematically shows a top view of an implementation of a portion of an embodiment of a wideband power amplifier in LTCC or IPD technology.

FIG. 1a schematically shows in a circuit diagram an example of an embodiment of an amplification stage 100. The amplification stage 100 is configured to be used in a power amplifier and is configured to amplify a signal in a bandwidth around an operational frequency. The amplification stage 100 comprises a stage input terminal 102, a stage output terminal 110, an amplifier 106, an input compensation network 103 and an output compensation network 109. The stage input terminal 102 receives a signal which must be amplified by the amplification stage 100. The stage output terminal 110 provides an amplified signal. The amplifier 106 comprises an amplifier input terminal 104 and an amplifier output terminal 108. The amplifier 106 is configured to amplify a signal received at the amplifier input terminal 104 towards a signal at the amplifier output terminal 108. The input compensation network 103 is coupled in between the stage input terminal 102 and the amplifier input terminal 104.

The input compensation network 103 comprises a first inductor L1, a first capacitor C1, a second inductor L2, a second capacitor C2 and a first supply voltage Vg at terminal 112. The first supply voltage terminal 112 is coupled to a supply voltage. The terminal is drawn as a separate feature of the circuit, because the components which are drawn in FIG. 1a as components coupled to the first supply voltage terminal 112 are preferably arranged close to the amplifier input terminal 104 in a manufactured circuitry. The second inductor L2 is coupled between the amplifier input terminal 104 and the first supply voltage terminal 112. The second capacitor C2 is coupled between the first supply voltage terminal 112 and a ground or reference plane which is coupled to a ground or reference voltage. It is to be noted that, in the manufactured circuitry, the second capacitor C2 may be arranged close to the amplifier 106 to have the advantageous effect of an RF blocking capacitance. The second conductor L2 is arranged between the indicated terminals to compensate for a parasitic input capacitance of the amplifier 106 in the bandwidth around the operational frequency. The input compensation network 103 further comprises a series arrangement of the first inductor L1 and the first capacitor C1. The series arrangement is coupled between the stage input terminal 102 and the amplifier input terminal 104. The series arrangement is arranged to transfer the signal received at the stage input terminal 102 to the amplifier input terminal 104 without much phase shifts and without absorbing much power of the signal within a relatively wide bandwidth around the operational frequency of the amplification stage.

The output compensation network 109 comprises a third inductor L3, a third capacitor C3, a fourth inductor L4, a fourth capacitor C4 and a second supply voltage terminal 114. The second supply voltage terminal 114 is coupled to the supply voltage Vd. The terminal is drawn as a separate feature of the circuit, because the components which are drawn in FIG. 1a as components coupled to the second supply voltage terminal 114 are preferably arranged close to the amplifier output terminal 108 in a manufactured circuitry. The fourth inductor L4 is coupled between the amplifier output terminal 108 and the second supply voltage terminal 114. The fourth capacitor C4 is coupled between the second supply voltage terminal 114 and a ground. It is to be noted that, in the manufactured circuitry, the fourth capacitor C4 may be arranged close to the amplifier 106 to have the advantageous effect of an RF blocking capacitance. The fourth inductor L4 is arranged between the indicated terminals to compensate for a parasitic output capacitance of the amplifier 106 in the bandwidth around the operational frequency. The output compensation network 109 further comprises a series arrangement of the third inductor L3 and the third capacitor C3. The series arrangement is coupled between the amplifier output terminal 108 and the stage output terminal 110. The series arrangement is arranged to transfer the signal provided by the amplifier 106 at the amplifier output terminal 108 to the stage output terminal 110 without much phase shifts and without absorbing much power of the signal within a relatively wide bandwidth around the operational frequency of the amplification stage.

Figure 1B:
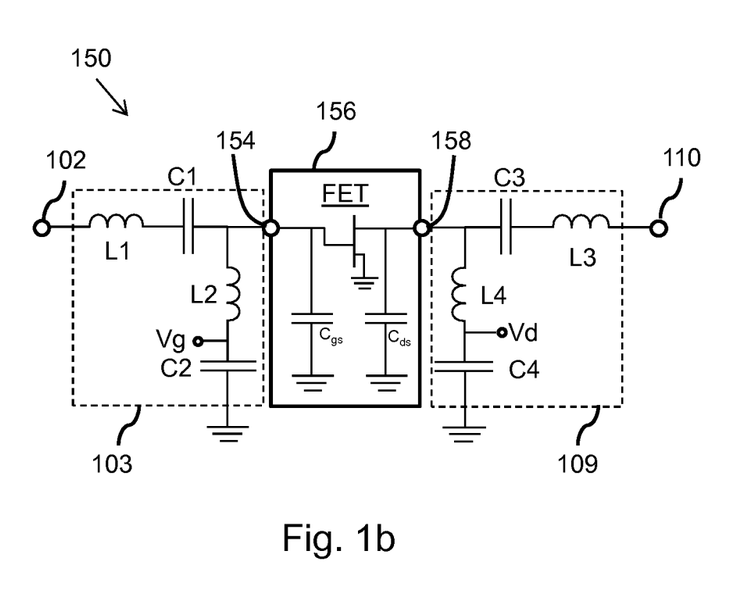

FIG. 1b schematically shows another circuit diagram of an embodiment of an amplification stage 150. Amplification stage 150 is similar to amplification stage 100 of FIG. 1a, however, it comprises a different amplifier 156. The amplifier 156 comprises a Field Effect Transistor FET for amplifying the signal received at the amplifier input terminal 154 towards a signal to be provided to the amplifier output terminal 158. The gate of the FET is coupled to the amplifier input terminal 154 and the drain is coupled to the amplifier output terminal, and the source is coupled to the ground. FIG. 1b further shows parasitic input and output capacitances $C_{gs}$, $C_{ds}$ of the FET. The parasitic input capacitance $C_{gs}$ s coupled between the gate of the FET and the ground.

The parasitic output capacitance $C_{ds}$ is coupled between the drain of the FET and the ground.

Especially the value of the first inductor L1 and the first capacitor C1 may relate to different parameters of the amplifier 156. In addition to the parasitic input capacitance the subsequent parameters are relevant: Input impedance of FET of the amplifier 156 depends on the die size of the FET. The amplification stage is designed to operate in a bandwidth around the operational frequency $\omega_0$. Further, the supply voltage of the amplification stage is $V_d$.

Than the first inductor L1 preferably has the inductance $L1 = C_{gs}(\text{Re}(Zin))^2$ and the first capacitor C1 has preferably the capacitance $$C1 = \frac{L_2}{(\text{Re}(Z_{in}))^2}.$$

$\text{Re}(Z_{in})$ is real part of an input impedance of the amplifier 156 in the middle of the bandwidth. L2 is the inductance of the second inductor L2. L2 has to be selected to resonate within the bandwidth with input capacitance of the amplifier 156 (in case the amplifier comprises, for example, a Field Effect Transistor, the input capacitance is $C_{gs}$, which is the gate-source capacitance of the Field Effect Transistor).

The value of the third inductor L3 and the value of the third capacitor C3 may relate to the value of the parasitic capacitance $C_{ds}$, and to the parameters discussed above. Than the third inductor L3 preferably has the inductance $$L3 = 4C_{ds}\left(\frac{V_d}{I_{d\_max}}\right)^2$$

and the third capacitor C3 has preferably the capacitance $$C3 = \frac{1}{4\omega_0^2 C_{ds}}\left(\frac{I_{d\_max}}{V_d}\right)^2.$$

The capacitance of the second capacitor C2 and the fourth capacitor C4 (both acting as a blocking capacitor) selected to provide minimal impedance at the lowest frequency of operational bandwidth, and the inductance of the second inductor L2 and the fourth inductor L4 relate to the parasitic capacitances $C_{gs}$, $C_{ds}$ of the FET of the amplifier 156 to provide their compensation at the selected frequency of operational bandwidth, which may be in the middle or on any side of it. In an embodiment, the inductance of the second inductor L2 is $$L2 = \frac{1}{\omega_0 C_{gs}}.$$

The In a further embodiment, the inductance of the fourth inductor L4 is $$L4 = \frac{1}{\omega_0 C_{ds}}.$$

The parameter $\omega_0$ has been discussed above.

It has been proven by simulation that the amplification stage of FIGS. 1a and 1b have an advantageous response for an operational frequency $\omega_0$ in the gigaherz spectral range, for example, in the range from 1 to 3 GHz. By choosing, in accordance to the above discussed capacitances and inductances, the response of the amplification stage is advantageous in a relatively wide bandwidth around the operational frequency $\omega_0$. For example, a relatively constant phase shift may be obtained in this relatively wide bandwidth while obtaining a relatively high amplification factor as well.

Figure 2A:
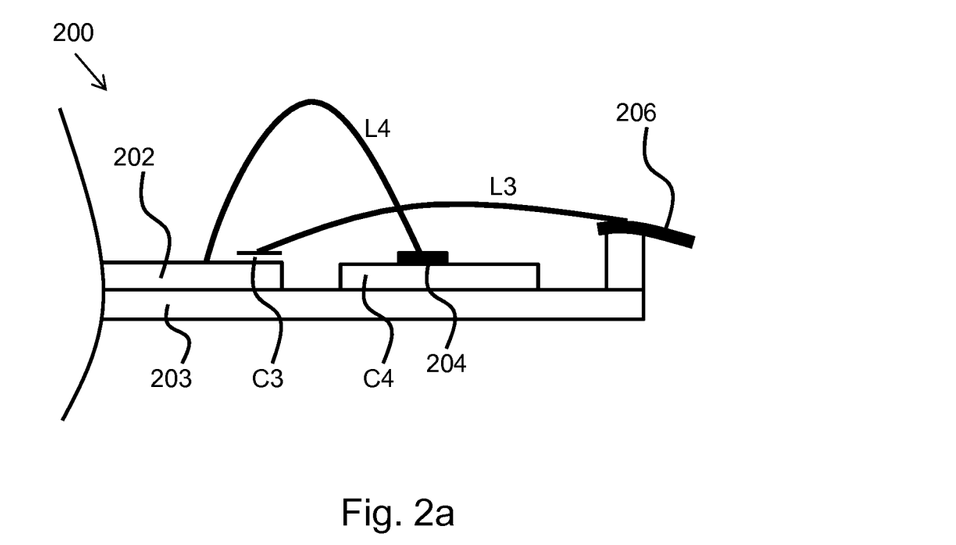

FIG. 2a schematically shows an implementation 200 of a portion of an embodiment of an amplification stage in Low Temperature Co-fired ceramic (LTCC) technology. FIG. 2a only presents a portion which comprises the amplifier 156 and the output compensation network 109 and mainly relates to the amplification stage 150 of FIG. 1b. It is to be noted that FIG. 2a presents a cross-sectional view of the implementation 200 and that the implementation extends in a direction perpendicular to a plane of the drawing.

The implementation 200 comprises a supporting base 203 on which a Field Effect Transistor 202 (FET) is provided. On top of the FET 202 is arranged the third capacitor C3. Separately from the FET 202 is provided the fourth capacitor C4 on the supporting base 203. At the right end of the figure, an output lead 206 (which represents the stage/package output terminal 110) is provided which is a relatively thick conductor. On top of the fourth capacitor C4 is provided the second supply voltage terminal 204 which is coupled to the supply voltage of the circuit. The fourth capacitor C4 is coupled with one terminal the second supply voltage terminal 204. The third inductor L3 and the fourth inductor are provided in the form of bonded wires. It is to be noted that the skilled person knows that in many practical implementations 200, 250, a plurality of parallel arranged bonded wires are used to obtain the inductors L3 and L4 such that the inductors L3 and L4 are capable of conducting a high enough current.

Figure 2B:
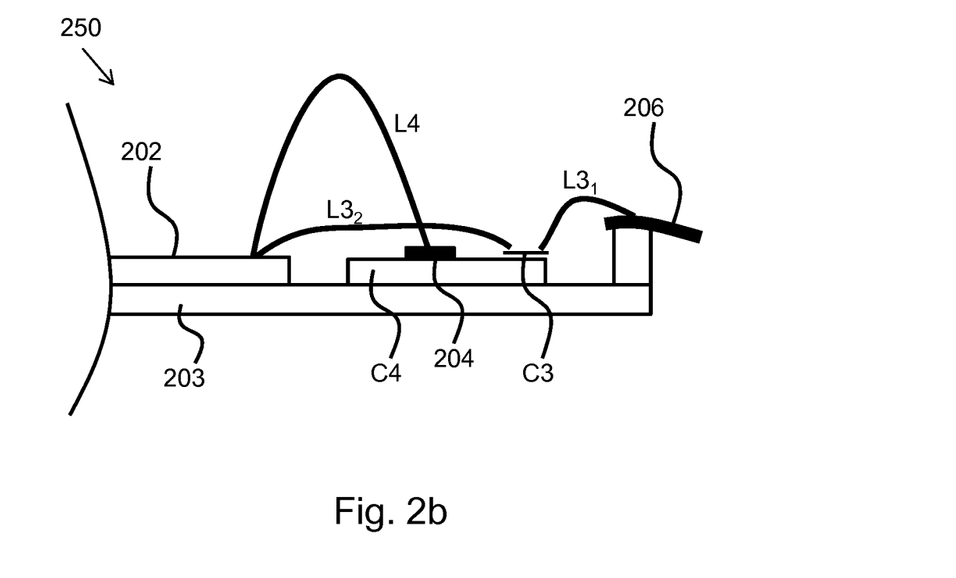

FIG. 2b schematically shows another implementation 250 of the same portion of the amplification stage 150 of FIG. 1b in Integrated Passive Device (IPD) technology. In this technology the third capacitor C3 has to be manufactured on top of IPD or LTCC die and, consequently, the third inductor L3 is implemented by means of a series arrangement of two bonded wires $L3_1$ and $L3_2$.

It is to be noted that, as discussed above, the amplification stages are implemented in Integrated Passive Device (IPD) technology or in Low Temperature Co-fired ceramic (LTCC) technology. However, the embodiments of the application are not limited to implementations in such technology. The amplification stages may also be implemented in an integrated circuit. The amplifier may be formed by a bipolar transistor, HBT, a Metallic Oxide Semiconductor (MOS) transistor or a field effect transistor (FET), PHEMT. The capacitor and inductors may be manufactured as integrated capacitors and inductors.

Figure 8A:
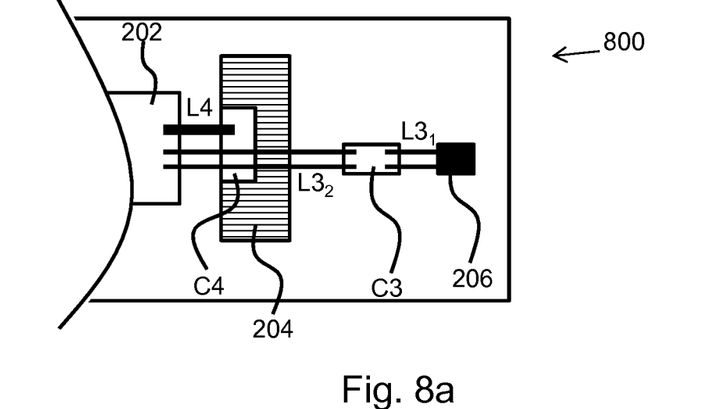

FIG. 8a presents a top view 800 of an implementation of a portion of an amplification stage. The top view is of an implementation which is similar to the LTCC implementation of FIG. 2a or which is similar to the IPD implementation of FIG. 2b.

Figure 3:
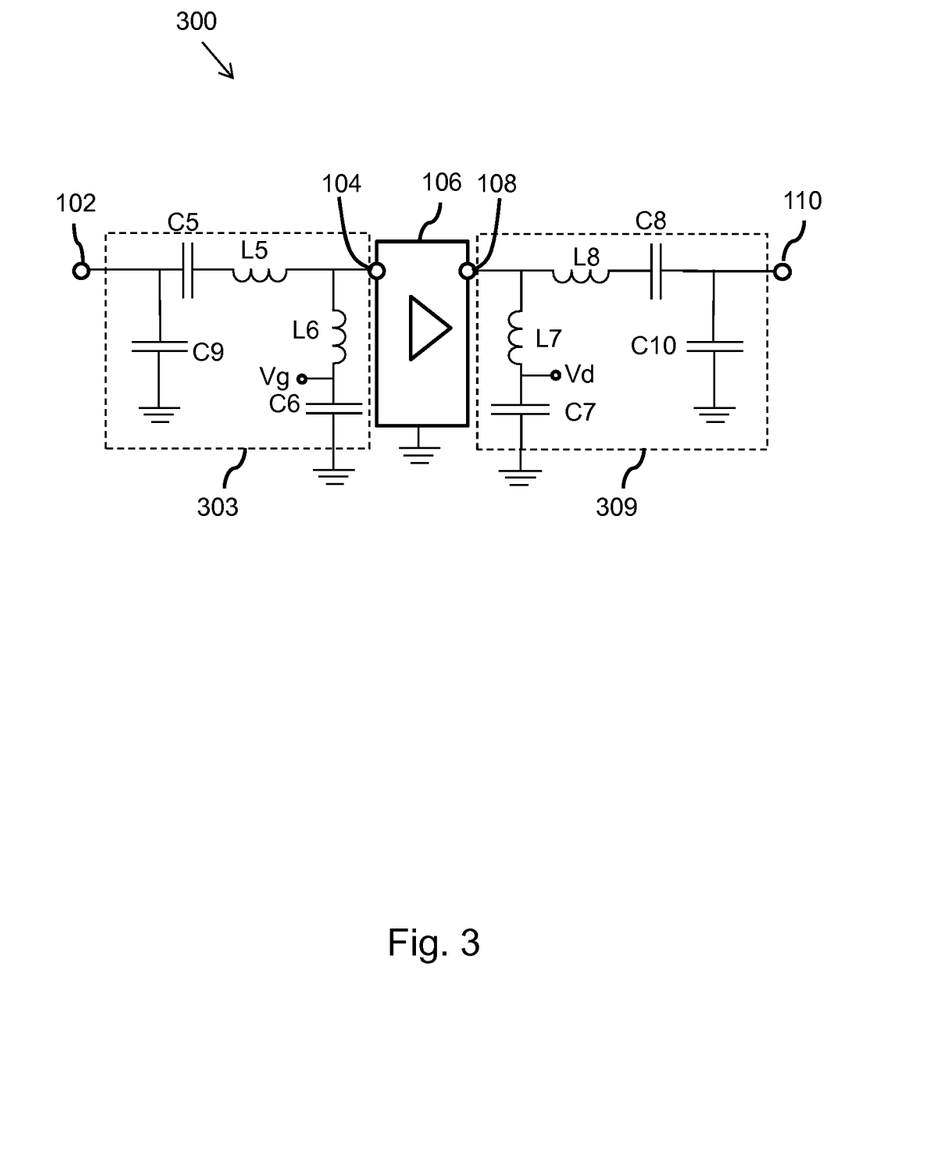

FIG. 3 schematically shows a further example of an embodiment of an amplification stage 300. Compared to amplification stage 100 of FIG. 1a, additional capacitors C9 and C10 are provided in respectively, the input compensation network 303 and the output compensation network 309, and the capacitors C5/C8 and the inductors L5/L8 of the series arrangements C5-L5, C8-L8 of, respectively, the input compensation network 303 and the output compensation network 309, are arranged in another order. The additional capacitors C9 and C10 are used for additional impedance transformation for, respectively, the input compensation network 303 and the output compensation network 309 such that, in a relatively wide bandwidth around the operational frequency, the amplification stage provides a relatively higher input and output impedance. In practical embodiments, such as for example the implementation 200, 250 of FIGS. 2a and 2b, the additional capacitors C9 and C10 instead of being implemented on LTCC/IPD dies, may be also formed by parasitic capacitors of the lead 206.

Figure 4:
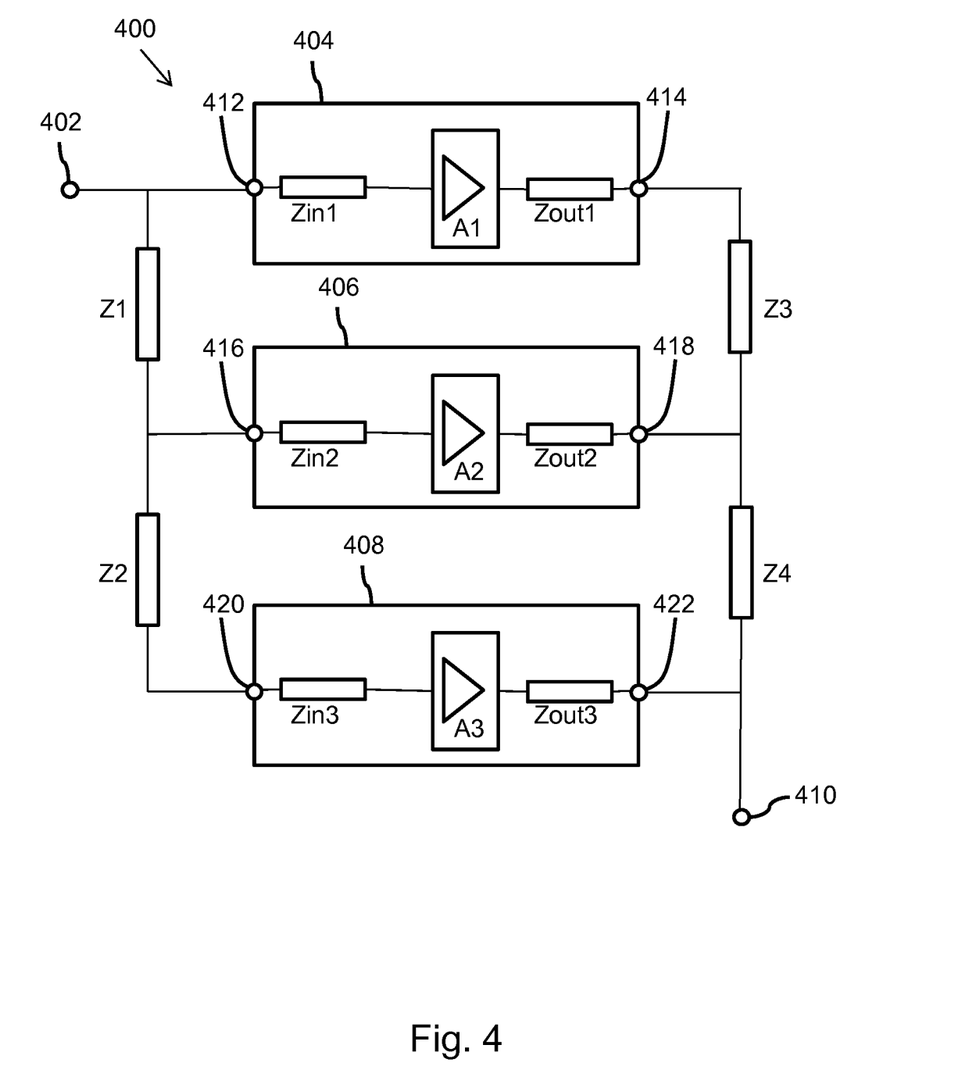

FIG. 4 schematically shows an example of an embodiment of a wideband power amplifier 400. The wideband power amplifier comprises a first amplification stage 404, a second amplification stage 406 and a third amplification stage 408. At least one of the first amplification stage 404, the second amplification stage 406 and the third amplification stage 408 is an amplification stage according to the first aspect of the invention (which are, for example, presented in FIGS. 1a, 1b and 3). The first amplification stage 404 comprises a first stage input terminal 412 and a first stage output terminal 414 and the input compensation network of the first amplification stage 404 is schematically represented by Zin1, the output compensation network is schematically represented by Zout1, and the amplifier is represented by element A1. The second amplification stage 406 comprises a second stage input terminal 416 and a second stage output terminal 418 and the input compensation network of the second amplification stage 406 is schematically represented by Zin2, the output compensation network is schematically represented by Zout2, and the amplifier is represented by element A2. The third amplification stage 408 comprises a third stage input terminal 420 and a third stage output terminal 422 and the input compensation network of the third amplification stage 408 is schematically represented by Zin3, the output compensation network is schematically represented by Zout3, and the amplifier is represented by element A3.

The wideband power amplifier 400 comprises an input power distribution network which distributes power received at the power amplifier input terminal 402 to the respective amplification stages 404, 406, 408. In the example of FIG. 4, the input power distribution network comprises a series arrangement of two input transmission lines Z1 and Z2 or lumped element equivalents. An first input network terminal is coupled to the power amplifier input terminal 402 and to the first stage input terminal 412. A second input network terminal is coupled to a first input transmission line Z1 or a lumped element equivalent, and to a second input transmission line Z2 or a lumped element equivalent. The second input network terminal is coupled to the second stage input terminal 416. A third input network terminal is coupled to the second input transmission line Z1 or a lumped element equivalent and to the third stage input terminal 420.

The wideband power amplifier 400 further comprises an output combiner network which combines the output signals of the respective amplification stages 404, 406, 408 to provide a combined output signal, which is the amplified signal, to the power amplifier output terminal. In the example of FIG. 4, the output combiner network comprises a series arrangement of two output transmission lines Z3 and Z4 or lumped element equivalents. A first output network terminal is coupled to the first stage output terminal 414 and to a first output transmission line Z3 or its lumped element equivalent. A second output network terminal is coupled to the first output transmission line Z3 or its lumped element equivalent and to the second output transmission line Z4 or its lumped element equivalent. The second output network terminal is also coupled to the second stage output terminal 418. A third output network terminal is coupled to the second output transmission line Z4 or its lumped element equivalent, to the third stage output terminal 422 and to the power amplifier output terminal 410.

In an embodiment, the first input network transmission line Z1 or its lumped element equivalent, the second input network transmission line Z2 or its lumped element equivalent, the first output network transmission line Z3 or its lumped element equivalent, and/or the second output network transmission line Z4 or its lumped element equivalent, are configured to phase shift a signal of an operational frequency of the wideband power amplifier with 90 degrees, and, in an optional embodiment, they are configured to phase shift signals at the middle of (operational) bandwidth with a value that is relatively close to 90 degrees (for example, the phase shifts do not deviate more than 5 degrees from 90 degrees). In such a configuration, the wideband power amplifier 400 is arranged in a Doherty amplifier configuration. This configuration has the advantage that a relatively high amplification efficiency may be obtained. If input power distribution network and output power combine network designed to provide identical and constant or close to constant value of time group delay in all brunches of the power amplifier than wideband operation of the power amplifier is significantly improved.

In an embodiment, the impedance of the first input network transmission line Z1 or its lumped element equivalent is $$Z1 = Z_{in1} \sqrt{\frac{W_1}{W_1 + \alpha_2 W_2 + \alpha_3 W_3}}.$$

Optionally, the impedance of the second input network transmission line Z2 or its lumped element equivalents is $$Z2 = Z1 \sqrt{\frac{\alpha_2 W_2 + \alpha_3 W_3}{\alpha_2 W_2}}.$$

$Z_{in1}$ is the input impedance of the first amplification stage 404 which is seen by the input power distribution network at the first stage input terminal 412. $W_1$, $W_2$, $W_3$ are the (gate) widths of the amplifiers A1 ... A3 of, respectively, the first amplification stage 404, of the second amplification stage 406 and the third amplification stage 408 (which means, when the amplifiers A1 ... A3 comprise Field Effect Transistors (FETs) to amplify the signal, $W_1$, $W_2$, $W_3$ are the gate widths of the FETs). $\alpha_2$, $\alpha_3$ are coefficients which depend on bias conditions of and conduction angles of, respectively, the amplifiers A2 and A3 of, respectively, second amplification stage 406 and the third amplification stage 408. When these amplifiers A2 and A3 operate in a C-calls operational mode as the main (of often termed peak) amplification stage of the wideband power amplifier 400. If the amplifiers A2 and A3 comprise an LDMOS Field Effect Transistor (FET), the $\alpha_2$, $\alpha_3$ coefficients are represented by $$\alpha_n = \left(1 + \frac{V_{gs\_bias} - V_t}{V_{gs\_max}}\right)^2,$$

wherein $V_t$ is the gate threshold voltage (the voltage at which the FET output current becomes larger than 0), $V_{gs\_bias}$ is the applied DC gate bias voltage and $V_{gs\_max}$ is the gate-source RF voltage amplitude required for maximal drain current of the FET. Thus, the values of $\alpha_2$, $\alpha_3$ depend on chosen technology for the amplifiers A2 and A3.

The values of $W_1$, $W_2$, $W_3$ depend on a required back-off power range in which an efficiency of the wideband power amplifier 400 is high. For a 12 dB back-off power range, the ratios between the values for $W_1$, $W_2$, $W_3$ are 1:5:5.

In an embodiment, the impedance of the first output network transmission line Z3 or its lumped element equivalent is $$Z3 = \frac{V_{d1}^2 (I_{d1} + I_{d2})^2 \left(1 + \frac{W_3}{W_2}\right)}{\left(1 + \frac{W_2}{W_1}\right) I_{d1}^2 (I_{d1} + I_{d2} + I_{d3})^2}.$$

Optionally, the impedance of the second output network transmission line Z4 or its lumped element equivalents is $$Z4 = \frac{2V_{d1}}{I_{d1} + I_{d2}}.$$

$V_{d1}$ is a supply voltage of the first amplification stage 404. $I_{d1}$, $I_{d2}$, $I_{d3}$ is the maximum current to be provided by, respectively, the first amplification stage 404, the second amplification stage 406 and the third amplification stage 408. The maximum current which may be provided by the respective amplification stage 404, 406, 406 strongly relates to, when the amplifiers A1 . . . A3 comprise a Field Effect Transistor (FET) for amplifying the signals, a die size of the FETs—it is the maximum current which may be conducted through the FET under normal operational conditions—it is the maximum current for which the FET is designed. $W_1$, $W_2$, $W_3$ are the widths of the amplifiers A1 . . . A3 of, respectively, the first amplification stage 404, the second amplification stage 406 and the third amplification stage 408. The widths of the amplifiers A1 . . . A3 are, when the amplifiers are FETs, the widths of the FETs of the amplifiers A1 . . . A3.

Figure 5:
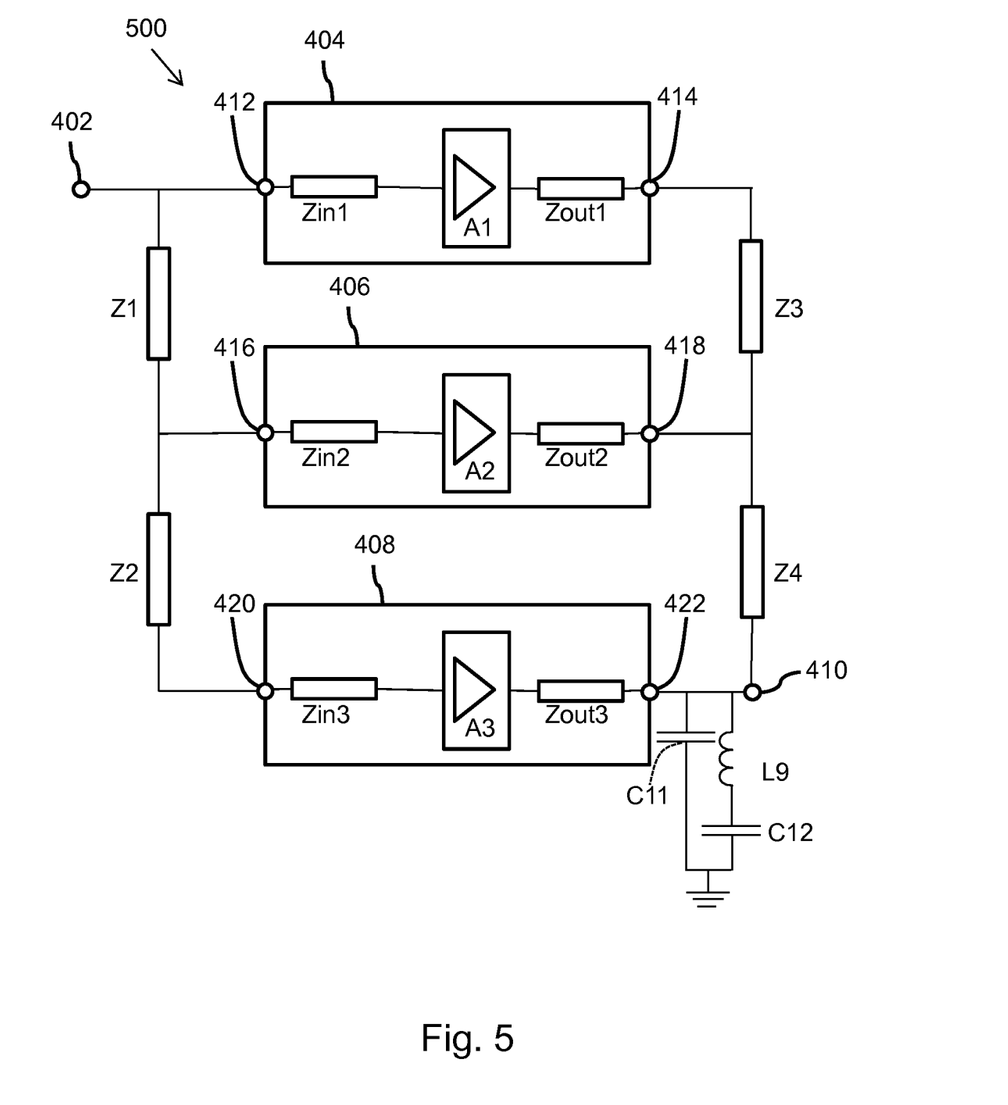

FIG. 5 schematically shows another example of an embodiment of a wideband power amplifier 500. The wideband power amplifier 500 is similar to wideband power amplifier 400 of FIG. 4, however, some additional elements are coupled in between the power amplifier output terminal 410 and a ground voltage. A eleventh capacitor C11 is coupled between the power amplifier output terminal 410 and the ground voltage and a series arrangement of a ninth inductor L9 and a twelfth capacitor C12 is coupled between the power amplifier output terminal 410 and the ground voltage. The eleventh capacitor C11 and the ninth inductor L9 are provided for additional correction of the signals in a relatively wide bandwidth around the operational frequency of the wideband power amplifier 500. The twelfth capacitor C12 is provided as an RF blocking capacitor.

It has been proven by simulation that the wideband power amplifier 400, 500 of FIGS. 4 and 5 have an advantages response for an operational frequency $\omega_0$ in the gigaherz spectral range, for example, in the range from 1 to 3 GHz. By choosing, in accordance with the previously discussed amplification stages and the above discussed transmission lines or their lumped element equivalents, the response of the amplification stage is advantageous in a relatively wide bandwidth around the operational frequency $\omega_0$. For example, a relatively constant phase shift may be obtained in this relatively wide bandwidth while obtaining a relatively high amplification factor as well. Furthermore, it has been proven that the wideband power amplifiers 400, 500 may be relatively efficient, even more efficient than know three stage Doherty amplifiers.

It is to be noted that, as discussed previously, the amplification stages of the wideband power amplifier may be implemented in Integrated Passive Device (IPD) technology or in Low Temperature Co-fired ceramic (LTCC) technology. In an embodiment, the wideband power amplifier as a whole may be implemented in these technologies. However, the embodiments of the application are not limited to implementations in such technology. The amplification stages may also be implemented in an integrated circuit. The amplifier may be formed by a bipolar transistor, a Metallic Oxide Semiconductor (MOS) transistor or a field effect transistor (FET). The capacitor and inductors may be manufactured as integrated capacitors and inductors.

Figure 6:
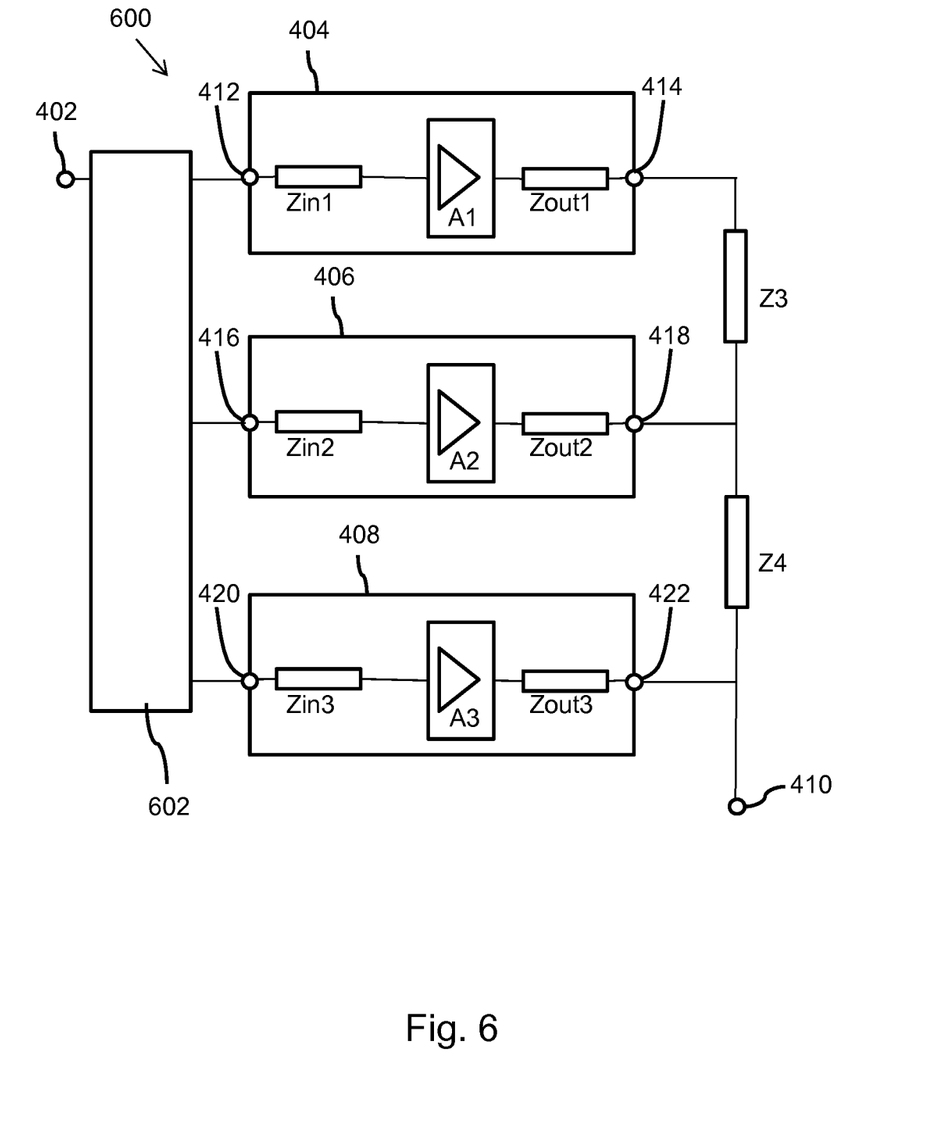

FIG. 6 schematically shows a further example of an embodiment of a wideband power amplifier 600. The wideband power amplifier 600 is similar to wideband power amplifier 400 of FIG. 4, however, instead of the input power distribution network comprising the transmission lines Z1 and Z2 (or their lumped element equivalents), the wideband power amplifier 600 comprises an active power distribution circuitry 602 which is configured to continuously monitoring an input signal received at the power amplifier input terminal 402 and adapting the distribution of the power, amplitude and phase of input signal from the power amplifier input terminal 402 to the respective amplification stage 404, 406, 408 in dependence of the analysis and power level of the input signal at specific frequency of operational bandwidth. Such active power distribution circuitry 602 is known by the skilled person and he is able to adapt their operation to the specific characteristics of the amplification stages 404, 406, 408. The active power distribution circuitry 602 allows an optimization of the efficiency of the wideband power amplifier 600 and allows an optimization for obtaining the best linear amplification of the input signal in a wide operational band/>35%/without significant degradation of power Efficiency.

Figure 7:
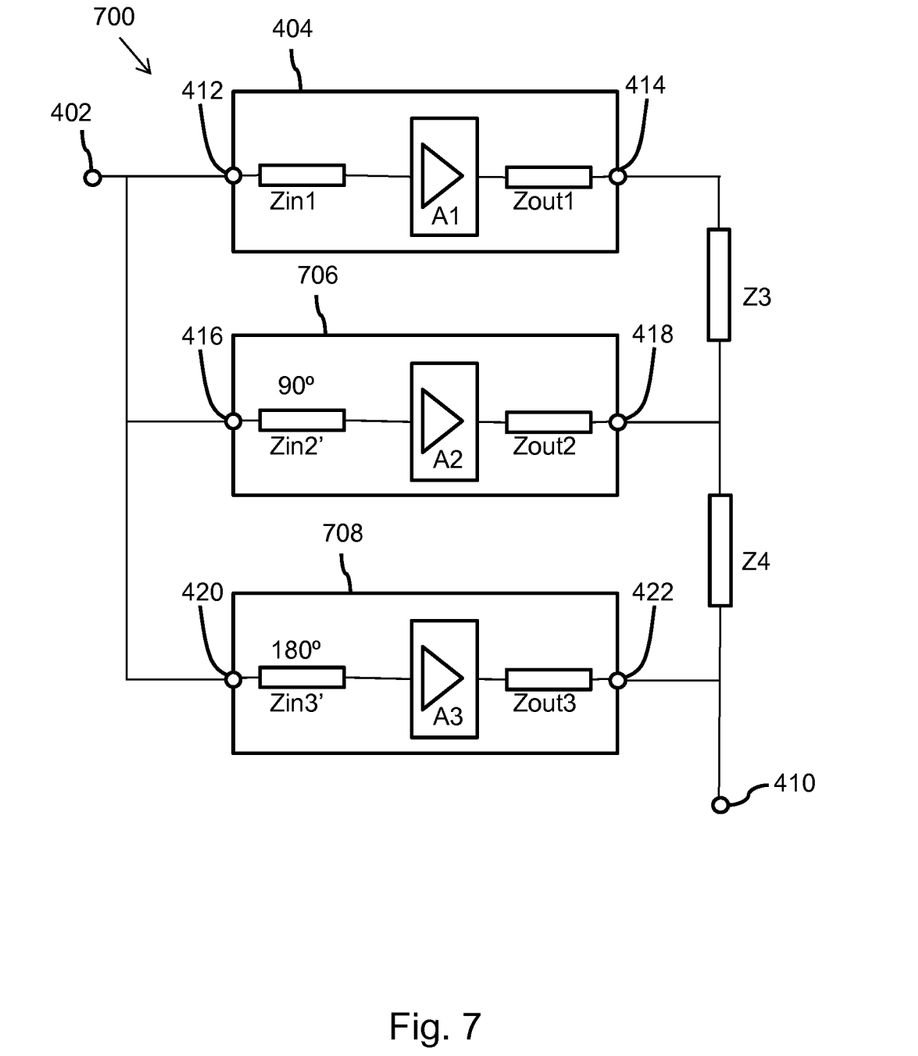

FIG. 7 schematically shows a subsequent example of an embodiment of a wideband power amplifier 700. The wideband power amplifier 700 is similar to wideband power amplifier 400 of FIG. 4, however, instead of the input power distribution network comprising the transmission lines Z1 and Z2 (or their lumped element equivalents), the power amplifier input terminal 402 is directly coupled to the stage input terminals of the first amplification stage 404, a second amplification stage 706, and a third amplification stage 708. The second amplification stage 706 is similar to the second amplification stage 406 of FIG. 4, however, the input compensation network Zin2' of the second amplification stage 706 causes, in addition to the other functions of the input compensation network, a 90° phase shift of a signal received at the stage input terminal 416 of the second amplification stage 706. The third amplification stage 708 is similar to the third amplification stage 408 of FIG. 4, however, the input compensation network Zin3' of the third amplification stage 708 causes, in addition to the other functions of the input compensation network, a 180° phase shift of a signal received at the stage input terminal 420 of the third amplification stage 706. Additionally, the Zin1, Zin2 and Zin3 are desired and may be designed to provide phase frequency response to provide identical group delay time and response for every each of three/or more/amplification branch connected between input 402 and output 410 of entire amplifier.

Figure 8B:
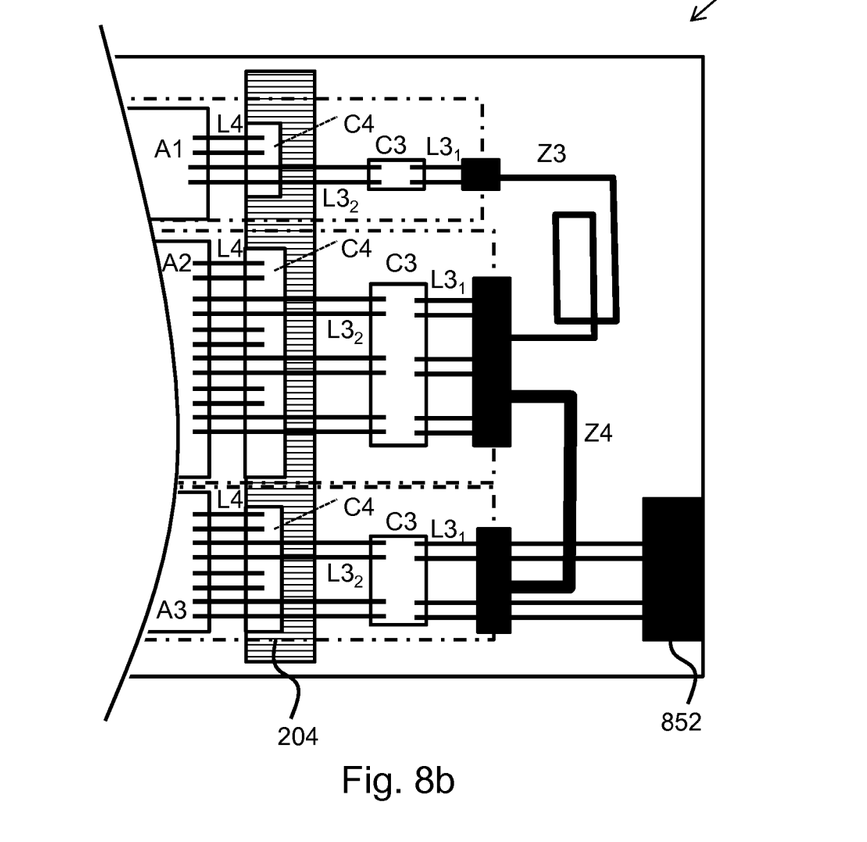

FIG. 8b schematically shows a top view 850 of an implementation of a wideband power amplifier which is implemented in LTCC or IPD technology. Indicated with dashed lines three different amplification stages may be recognized. For each amplification stage a portion is shown which comprises the amplifier A1 . . . A3, the output compensation network formed by capacitors C3, C4 and inductors L3, L4. The top-view further shows the output combiner network comprising transmission lines Z3 and Z4. Element 204 is a power line with the supply voltage. Element 852 is the output lead of the wideband power amplifier.

The embodiments of the application may be summarized as follows: An amplification stage and a wideband power amplifier are provided. The amplification stage comprises a stage input terminal, a stage output terminal, an amplifier, an input compensation network, and in output compensation network. At the stage input terminal is received a signal which is provided via the input compensation network to the amplifier. The input compensation network filters the signal to allow a wideband operation of the amplification stage around an operational frequency. The amplified signal provided by the amplifier is provided via the output compensation network to the stage output terminal. The output compensation network filters the amplified signal to allow a wideband operation of the amplification stage around the operational frequency. The wideband power amplifier comprises a plurality of amplification stage combined with transmission lines or their lumped element equivalents in a specific circuit topology.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa.

Because the amplification stages and the wideband power amplifiers according to the present invention are, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An amplification stage for use in a power amplifier and for amplifying a signal in a bandwidth around an operational frequency, the amplification stage comprising:
   a stage input terminal for receiving a signal to be amplified;
   a stage output terminal for providing an amplified signal;
   an amplifier comprising an amplifier input terminal and an amplifier output terminal, the amplifier configured to amplify a signal received at the amplifier input terminal towards a signal provided at the amplifier output terminal;
   an input compensation network configured to allow a wideband operation of the amplification stage around the operational frequency, the input compensation network arranged in between the stage input terminal and the amplifier input terminal, the input compensation network comprising a first series arrangement of a first inductor and a first capacitor, the input compensation network further comprising a second inductor and a second capacitor, the first series arrangement coupled between the stage input terminal and the amplifier input terminal, the first series arrangement to transfer the signal received at the stage input terminal with a zero phase shift of the signal, the second inductor coupled between the amplifier input terminal and a first supply voltage terminal coupled to a supply voltage, and the second capacitor coupled between the first supply voltage terminal and a ground voltage; and an output compensation network configured to allow a wideband operation of the amplification stage around the operational frequency, the output compensation network arranged in between the amplifier output terminal of the amplifier and the stage output terminal, the output compensation network comprising a second series arrangement of a third inductor and a third capacitor, the output compensation network further comprising a fourth inductor and a fourth capacitor, the second series arrangement coupled between the amplifier output terminal and the stage output terminal, the fourth inductor coupled between the amplifier output terminal and a second supply voltage terminal coupled to the supply voltage, and the fourth capacitor coupled between the second supply voltage terminal and a ground voltage.

2. An amplification stage according to claim 1, wherein an inductance of the first inductor is substantially equal to $L1=C_{gs}(Re(Zin))^2 L1$,
a capacitance of the first capacitor is substantially equal to $$C1 = \frac{L_2}{(Re(Z_{in}))^2},$$

wherein $\omega_0$ is the operational frequency, $V_d$ is the supply voltage, $C_{gs}$ is the parasitic input capacitance of the amplifier, L2 is the inductance of the second inductor, and $Re(Z_{in})$ is real part of an input impedance of the amplifier in the middle of the bandwidth.

3. An amplification stage according to claim 1, wherein an inductance of the third inductor is substantially equal to $L1=C_{gs}(Re(Zin))^2$,
a capacitance of the third capacitor is substantially equal to $$C3 = \frac{1}{4\omega_0^2 C_{ds}} \left(\frac{I_{d\_max}}{V_d}\right)^2,$$

wherein $\omega_0$ is the operational frequency, $V_d$ is the supply voltage, $I_{d\_max}$ is the maximum current to be provided by the amplifier, $C_{ds}$ is the parasitic output capacitance of the amplifier.

4. An amplification stage according to claim 1, wherein the second inductor is configured to compensate a parasitic input capacitance of the amplifier in the bandwidth around the operational frequency or the fourth inductor is configured to compensate a parasitic output capacitance of the amplifier in the bandwidth around the operational frequency.

5. An amplification stage for use in a power amplifier and for amplifying a signal in a bandwidth around an operational frequency, the amplification stage comprising:

a stage input terminal for receiving a signal to be amplified;

a stage output for providing an amplified signal;

an amplifier comprising an amplifier input terminal and an amplifier output terminal, the amplifier configured to amplify a signal received at the amplifier input terminal towards a signal provided at the amplifier output terminal;

input compensation network configured to allow a wideband operation of the amplification stage around the operational frequency, the input compensation network arranged in between the stage input terminal and the amplifier input terminal, the input compensation network comprising a first series arrangement of a first inductor and a first capacitor, the input compensation network further comprising a second inductor and a second capacitor, the first series arrangement coupled between the stage input terminal and the amplifier input terminal, the second inductor coupled between the amplifier input terminal and a first supply voltage terminal coupled to a supply voltage, and the second capacitor coupled between the first s voltage terminal and a ground voltage; and an output compensation network configured to allow a wideband operation of the amplification stage around the operational frequency, the output compensation network arranged in between the amplifier output terminal of the amplifier and the stage output terminal, the output compensation network comprising a second series arrangement of a third inductor and a third capacitor, the output compensation network further comprising a fourth inductor and a fourth capacitor, the second series arrangement coupled between the amplifier output terminal and the stage output terminal, the fourth inductor coupled between the amplifier output terminal and a second supply voltage terminal coupled to the supply voltage, and the fourth capacitor coupled between the second supply voltage terminal and a ground voltage, wherein the second capacitor is configured as an RF blocking capacitance or the fourth capacitor is configured as an RF blocking capacitance.

6. An amplification stage according to claim 1 which is manufactured in an integrated passive component technology, the integrated passive component technology being one of Integrated Passive Device or Low Temperature Co-fired ceramic.

7. An amplification stage according to claim 1 wherein the amplifier is based on a Field Effect Transistor.

8. A wideband power amplifier comprising:

an power amplifier input terminal for receiving a signal to be amplified;

an power amplifier output terminal for providing an amplified signal;

a plurality of amplification stages, including a first amplification stage, the first amplification stage comprising:

a stage input terminal for receiving a signal to be amplified;

a stage output terminal for providing an amplified signal;

an amplifier comprising an amplifier input terminal and an amplifier output terminal, the amplifier configured to amplify a signal received at the amplifier input terminal towards a signal provided at the amplifier output terminal;

an input compensation network configured to allow a wideband operation of the amplification stage around the operational frequency, the input compensation network arranged in between the stage input terminal and the amplifier input terminal, the input compensation network comprising a first series arrangement of a first inductor and a first capacitor, the input compensation network further comprising a second inductor and a second capacitor, the first series arrangement coupled between the stage input terminal and the amplifier input terminal, the second inductor coupled between the amplifier input terminal and a first supply voltage terminal coupled to a supply voltage, and the second capacitor coupled between the first supply voltage terminal and a ground voltage; and an output compensation network configured to allow a wideband operation of the amplification stage around the operational frequency, the output compensation network arranged in between the amplifier output terminal of the amplifier and the stage output terminal, the output compensation network comprising a second series arrangement of a third inductor and a third capacitor, the output compensation network further comprising a fourth inductor and a fourth capacitor, the second series arrangement coupled between the amplifier output terminal and the stage output terminal, the fourth inductor coupled between the amplifier output terminal and a second supply voltage terminal coupled to the supply voltage, and the fourth capacitor coupled between the second supply voltage terminal and a ground voltage;

an input power distribution circuitry configured to distribute power from the power amplifier input terminal to the plurality of amplification stages;

an output combiner network configured to combine the output signals of the plurality of amplification stages and to provide the amplified signal to the power amplifier output terminal.

9. A wideband power amplifier according to claim 8, wherein the input power distribution circuitry comprises transmission lines or lumped element equivalents connected in series, the input power distribution circuitry comprising a first input terminal, a last input terminal and intermediate input terminals between the neighbouring transmission lines or lumped element equivalents, wherein the stage input terminal of each one of the plurality of amplification stages is connected to the input power distribution circuitry at another one of the first input terminal, intermediate input terminals and the last input terminal, the number of transmission lines or lumped element equivalents being equal to a number of amplification stages minus one, the first input terminal being the power amplifier input terminal.

10. A wideband power amplifier according to claim 9, wherein successive transmission lines or lumped element equivalents of the input power distribution circuitry are configured to phase shift the input signal with 90 degrees.

11. A wideband power amplifier according to claim 8, wherein the output combiner network comprises transmission lines or lumped element equivalents connected in series, the output combiner network comprising a first output terminal, a last output terminal and intermediate output terminals between the neighbouring transmission lines or lumped element equivalents, wherein each one of the plurality of amplification stages is connected to the output combiner network at another one of the first output terminal, intermediate output terminals and the last output terminal, the number of transmission lines or lumped element equivalents being equal to a number of amplification stages minus one, the last output terminal being the power amplifier output terminal.

12. A wideband power amplifier according to claim 11, wherein successive transmission lines or lumped element equivalents of the output combiner network are configured to phase shift the output signal with 90 degrees.

13. A wideband power amplifier according to claim 8, wherein:

the wideband power amplifier comprises the first amplification stage, a second amplification stage and a third amplification stage, the output combiner network comprises a first transmission line or lumped element equivalents being coupled between the stage output terminal of the first amplification stage and the stage output terminal of the second amplification stage and having a first impedance, the output combiner network further comprises a second transmission line or lumped element equivalents being coupled between the stage output terminal of the second amplification stage and the stage output terminal of the third amplification stage and having a second impedance, the stage output terminal of the third amplification stage is coupled to the power amplifier output terminal, the first impedance is substantially equal to $$Z_{o1} = \frac{V_{d1}^2(I_{d1}+I_{d2})^2\left(1+\frac{W_3}{W_2}\right)}{\left(1+\frac{W_2}{W_1}\right)I_{d1}^2(I_{d1}+I_{d2}+I_{d3})^2}$$

and the second impedance is substantially equal to $$Z_{o1} = \frac{V_{d1}^2(I_{d1}+I_{d2})^2\left(1+\frac{W_3}{W_2}\right)}{\left(1+\frac{W_2}{W_1}\right)I_{d1}^2(I_{d1}+I_{d2}+I_{d3})^2}$$

wherein $V_{d1}$ is a supply voltage of the first amplification stage, $I_{d1}$, $I_{d2}$, $I_{d3}$ is the maximum current to be provided by, respectively, the first amplification stage, the second amplification stage and the third amplification stage, $W_1$, $W_2$, $W_3$ are the widths of the amplifiers of, respectively, the first amplification stage, the second amplification stage and the third amplification stage, and, when the amplifiers comprise a Field Effect Transistor, $W_1$, $W_2$, $W_3$ are the gate widths of the FETs.

14. A wideband power amplifier according to claim 8, wherein:

the input power distribution circuitry comprises a third transmission line or lumped element equivalents being coupled between the stage input terminal of the first amplification stage and the stage input terminal of the second amplification stage and having a third impedance, the input power distribution circuitry further comprises a fourth transmission line or lumped element equivalents coupled between the stage input terminal of the second amplification stage and the stage input terminal of the third amplification stage and having a fourth impedance, the stage input terminal of the first amplification stage is coupled to the power amplifier input terminal, the third impedance is substantially equal to $$Z_{i3} = Z_{in1}\sqrt{\frac{W_1}{W_1+\alpha_2 W_2+\alpha_3 W_3}},$$

the fourth impedance is substantially equal to $$Z_{i3} = Z_{in1}\sqrt{\frac{W_1}{W_1 + \alpha_2 W_2 + \alpha_3 W_3}},$$

wherein $Z_{in1}$ is the input impedance of the first amplification stage, $W_1$, $W_2$, $W_3$ are the widths of the amplifiers of, respectively, the first amplification stage, the second amplification stage and the third amplification stage, and $\alpha_2$, $\alpha_3$ are coefficients which depend on bias conditions of, respectively, the second amplification stage and the third amplification stage, and, when the amplifiers comprise a Field Effect Transistor, $W_1$, $W_2$, $W_3$ are the gate widths of the FETs.

15. A wideband power amplifier according to claim 13, wherein the ratios between the values of $W_1$, $W_2$, $W_3$ are substantially equal to 1:5:5.

16. A wideband power amplifier according to claim 8, wherein the input power distribution circuitry comprises an active power distribution circuitry which is configured to continuously adapt and perform the distributing of power from the power amplifier input terminal to the plurality of amplification stages in dependence of the signal received at the power amplifier input terminal.

17. A wideband power amplifier according to claim 8, wherein the wideband power amplifier comprises the first amplification stage, a second amplification stage and a third amplification stage, the input power distribution circuitry comprises a direct connection between the power amplifier input terminal and the stage input terminals of the first amplification stage, the second amplification stage and the third amplification stage, the input compensation network of the second amplification stage is also configured to phase shift the signal received at the stage input terminal of the second amplification stage with 90°, the input compensation network of the third amplification stage is also configured to phase shift the signal received at the stage input terminal of the third amplification stage with 180°.

18. A wideband power amplifier according to claim 8 which is manufactured in an integrated passive component technology, the integrated passive component technology being one of Integrated Passive Device or Low Temperature Co-fired ceramic, wherein compensation and/or impedance inverters of the output combiner network are manufactured by using distributed lines or lumped element technology.

* * * * *